(12) United States Patent
Yoshinaga et al.

(10) Patent No.: US 10,790,229 B2
(45) Date of Patent: Sep. 29, 2020

(54) SEMICONDUCTOR MEMORY DEVICE (71) Applicant: Toshiba Memory Corporation, Minato-ku (JP)

(72) Inventors: Kenta Yoshinaga, Yokkaichi (JP); Hideki Inokuma, Yokkaichi (JP); Hisashi Kato, Yokkaichi (JP); Masakazu Sawano, Mie (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/115,844

(22) Filed: Aug. 29, 2018

(65) Prior Publication Data
US 2019/0287903 A1    Sep. 19, 2019

(30) Foreign Application Priority Data
Mar. 15, 2018   (JP) ................................. 2018-047390

(51) Int. Cl.
*H01L 23/528* (2006.01)
*H01L 29/792* (2006.01)
(Continued)

(52) U.S. Cl.
CPC ...... *H01L 23/5283* (2013.01); *H01L 21/0217* (2013.01); *H01L 27/101* (2013.01); *H01L 29/792* (2013.01)

(58) Field of Classification Search
CPC ............... H01L 23/5283; H01L 29/792; H01L 27/11573; H01L 27/101; H01L 27/11575;
(Continued)

(56) References Cited

U.S. PATENT DOCUMENTS 7,855,457 B2   12/2010   Mizukami et al.
8,664,108 B2    3/2014   Mizukami et al.
(Continued)

FOREIGN PATENT DOCUMENTS

JP   2009-16400    1/2009
JP   2013-131580   7/2013
JP   2015-56452    3/2015

OTHER PUBLICATIONS

Mori, I., et al. "Challenges and Innovations in Advanced Lithography Technology", Toshiba Review, vol. 59, No. 8, 2004, 12 pages (with English Translation).

*Primary Examiner* — Thanh Y. Tran
(74) *Attorney, Agent, or Firm* — Oblon, McClelland, Maier & Neustadt, L.L.P.

(57)    ABSTRACT

A semiconductor memory device according to an embodiment includes a substrate; a plate-like first conductivity layer provided above the substrate and extending parallel to a substrate plane to bestride first and second regions; a plate-like second conductivity layer provided above the first conductivity layer to be separated from the first conductivity layer, an end portion of the first conductivity layer has a protruding staircase shape in the first region, the second conductivity layer extending parallel to the first conductivity layer to bestride the first and second regions; a first contact connected to the first conductivity layer at a side surface or a bottom surface of the first conductivity layer and extending from the first conductivity layer toward the substrate, the first contact being connected at a position where the end portion of the first conductivity layer in the first region protrudes, and a diameter size of a portion of the first contact connected at a side surface or a bottom surface of the first conductivity layer having a maximum diameter size; a second contact connected to the second conductivity layer at a side surface or a bottom surface of the second conductivity (Continued)

layer in the first region and extending from the second conductivity layer toward the substrate to penetrate the first conductivity layer, a diameter size of a portion of the second contact connected at a side surface or a bottom surface of the second conductivity layer having a maximum diameter size; a channel body penetrating the first and second conductivity layers in the second region; and a memory film including a charge accumulation portion provided between the first and second conductivity layers and the channel body in the second region.

20 Claims, 8 Drawing Sheets

(51) Int. Cl.
    *H01L 27/10*     (2006.01)
    *H01L 21/02*     (2006.01)

(58) Field of Classification Search
    CPC ........... H01L 27/11582; H01L 21/8229; H01L 21/8239; H01L 27/1052; H01L 27/10847; H01L 27/10823; H01L 27/1122; H01L 27/11273; H01L 27/11521; H01L 27/11531; H01L 27/11529; H01L 27/1157; H01L 27/24; H01L 29/685
See application file for complete search history.

(56) References Cited

U.S. PATENT DOCUMENTS

| | | |
|---|---|---|
| 8,742,586 B2 | 6/2014 | Mizukami et al. |
| 8,896,051 B2 | 11/2014 | Nansei |
| 9,029,938 B2 | 5/2015 | Nakaki |
| 9,257,388 B2 | 2/2016 | Mizukami et al. |
| 9,633,945 B1 | 4/2017 | Mizutani |
| 9,640,547 B2 | 5/2017 | Mizukami et al. |
| 2009/0020744 A1 | 1/2009 | Mizukami et al. |
| 2010/0224962 A1* | 9/2010 | Kim .................... H01L 23/5228 257/536 |
| 2011/0065272 A1 | 3/2011 | Mizukami et al. |
| 2012/0149185 A1* | 6/2012 | Kim .................... H01L 21/31053 438/589 |
| 2012/0187471 A1* | 7/2012 | Yu ..................... H01L 27/11565 257/324 |
| 2013/0228848 A1 | 9/2013 | Nansei |
| 2014/0042620 A1 | 2/2014 | Mizukami et al. |
| 2014/0217611 A1 | 8/2014 | Mizukami et al. |
| 2016/0197035 A1 | 7/2016 | Mizukami et al. |
| 2017/0110402 A1 | 4/2017 | Smith et al. |
| 2017/0194260 A1 | 7/2017 | Mizukami et al. |
| 2017/0271586 A1 | 9/2017 | Tanaka et al. |
| 2018/0240811 A1* | 8/2018 | Kim .................. H01L 27/11565 |

\* cited by examiner

SEMICONDUCTOR MEMORY DEVICE

CROSS-REFERENCE TO RELATED APPLICATION

This application is based upon and claims the benefit of priority from Japanese Patent Application No. 2018-047390, filed on Mar. 15, 2018, the entire contents of which are incorporated herein by reference.

FIELD

Embodiments described herein relate generally to a semiconductor memory device.

A large-capacity nonvolatile memory has been actively developed. This type of memory enables a low-voltage/low-current operation, high-speed switching, and scaling-down/high integration of memory cells.

In a large-capacity memory array, a large number of metal wirings called bit lines and word lines are arranged. Writing to one memory cell is performed by applying a voltage to a bit line and a word line connected to the memory cell. A memory device in which memory cells are three-dimensionally arranged using a stacked body in which conductivity layers to be the word lines and insulating layers are alternately stacked has been suggested. In the memory device in which the memory cells are three-dimensionally arranged, a structure for forming the conductivity layer stepwise to be shifted for each hierarchy and causing the conductivity layer to be easily connected to a contact from the upper layer side is realized as a structure for connecting the conductivity layer of each hierarchy to be stacked to the wiring of another hierarchy.

DETAILED DESCRIPTION

Hereinafter, embodiments will be described using the drawings. In the drawings, the same or similar places are denoted with the same or similar reference numerals.

In the present specification, to show a positional relation of components and the like, an upward direction in the drawing is described as "upper" and a downward direction in the drawing is described as "lower". In this specification, the concepts of "upper" and "lower" are not necessarily terms showing a relation with a direction of gravity.

A semiconductor memory device according to an embodiment includes a substrate; a plate-like first conductivity layer provided above the substrate and extending parallel to a substrate plane to bestride first and second regions; a plate-like second conductivity layer provided above the first conductivity layer to be separated from the first conductivity layer, an end portion of the first conductivity layer has a protruding staircase shape in the first region, the second conductivity layer extending parallel to the first conductivity layer to bestride the first and second regions; a first contact connected to the first conductivity layer at a side surface or a bottom surface of the first conductivity layer and extending from the first conductivity layer toward the substrate, the first contact being connected at a position where the end portion of the first conductivity layer in the first region protrudes, and a diameter size of a portion of the first contact connected at a side surface or a bottom surface of the first conductivity layer having a maximum diameter size; a second contact connected to the second conductivity layer at a side surface or a bottom surface of the second conductivity layer in the first region and extending from the second conductivity layer toward the substrate to penetrate the first conductivity layer, a diameter size of a portion of the second contact connected at a side surface or a bottom surface of the second conductivity layer having a maximum diameter size; a channel body penetrating the first and second conductivity layers in the second region; and a memory film including a charge accumulation portion provided between the first and second conductivity layers and the channel body in the second region.

Figure 1:
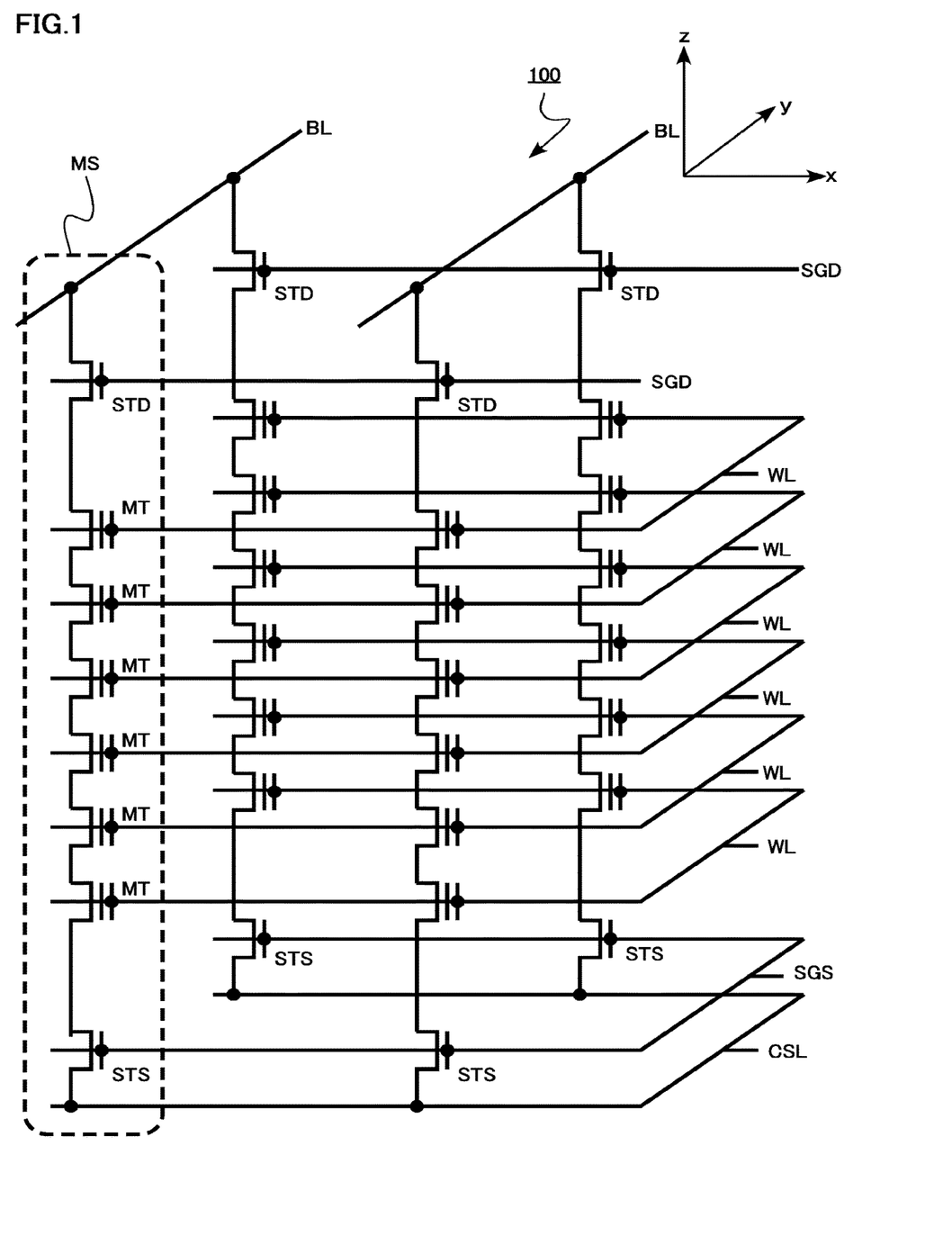
FIG. 1 is an equivalent circuit diagram of a semiconductor memory device according to an embodiment.

FIG. 1 is an equivalent circuit diagram of a semiconductor memory device 100 according to an embodiment.

The semiconductor memory device 100 according to the embodiment is a three-dimensional NAND flash memory in which memory cells are three-dimensionally provided.

As shown in FIG. 1, the semiconductor memory device 100 includes a plurality of word lines WL, a common source line CSL, a source select gate line SGS, a plurality of drain select gate lines SGD, a plurality of bit lines BL, and a plurality of memory strings MS.

The memory string MS has a source select transistor STS, a plurality of memory cell transistors MT, and a drain select transistor STD connected in series between the common source line CSL and the bit line BL.

The number of word lines WL, the number of bit lines BL, the number of memory strings MS, and the number of drain select gate lines SGD are not limited to those in FIG. 1.

Figure 2:
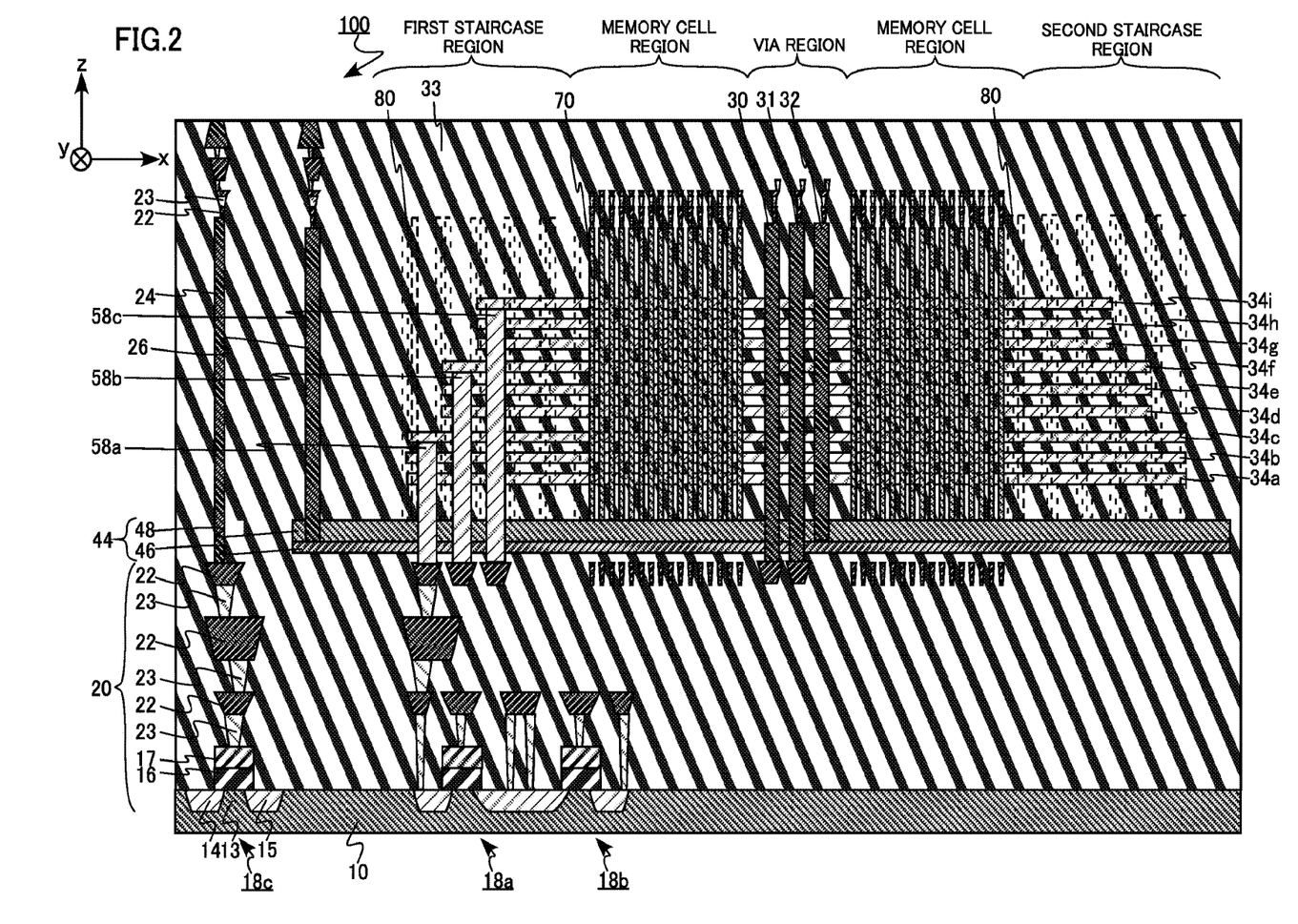
FIG. 2 is a schematic cross-sectional view of the semiconductor memory device according to the embodiment.

FIG. 2 is a schematic cross-sectional view of the semiconductor memory device according to the embodiment.

In FIG. 2, illustration of the source select gate line SGS, the drain select gate line SGD, the source select transistor STS, the drain select transistor STD, and the bit line BL is omitted.

A substrate 10 is, for example, a semiconductor substrate. The substrate 10 is, for example, a silicon substrate. In FIG. 2, the substrate 10 is provided such that an xy plane and a substrate plane are parallel.

The substrate 10 is provided with a plurality of transistors 18. For example, transistors 18a, 18b, and 18c are provided on the substrate 10. Each of the transistors 18a, 18b, and 18c has a source region 14 provided in an upper layer portion of the substrate 10, a drain region 15 provided in the upper layer portion of the substrate 10, a semiconductor region 13 provided in the upper layer portion of the substrate 10 between the source region 14 and the drain region 15, a gate insulating film 16 provided on the semiconductor region 13, and a gate electrode 17 provided on the gate insulating film 16. The transistors 18a, 18b, and 18c are, for example, field effect transistors. The transistors 18a, 18b, and 18c are used for driving a three-dimensional NAND flash memory. The transistors 18a, 18b, and 18c are examples of semiconductor elements. In an example of FIG. 2, the transistors 18a, 18b, and 18c are shown as the plurality of transistors 18.

An insulating layer 33 is provided on the substrate 10. The insulating layer 33 includes, for example, silicon oxide.

An integrated circuit 20 is provided in the substrate 10 and the insulating layer 33. The integrated circuit 20 has a plurality of transistors 18, contacts 23 electrically connected to the plurality of transistors 18, and wirings 22 electrically connected to the contacts 23.

A buried source line 44 is provided above the integrated circuit 20. The buried source line 44 has, for example, a buried source line lower layer portion 46 including W (tungsten) and a buried source line upper layer portion 48 including polysilicon. A potential is supplied from the integrated circuit 20 to the buried source line 44. The buried source line 44 corresponds to the common source line CSL of FIG. 1.

A plurality of plate-like conductivity layers 34 extending parallel to a plane of the substrate 10 are provided above the substrate 10 to bestride a first staircase region, a memory cell region, a via region, a memory cell region, and a second staircase region. For example, conductivity layers 34a, 34b, 34c, 34d, 34e, 34f, 34g, 34h, and 34i are stacked with the insulating layer 33 therebetween. The first staircase region is an example of a first region. The memory cell region is an example of a second region. In an example shown in FIG. 2, the plurality of conductivity layers 34 are formed in sets of, for example, three layers and are formed stepwise in an x direction in FIG. 2 for each set. Specifically, the conductivity layers 34 are provided as follows.

The conductivity layer 34b is a plate-like conductivity layer provided above the conductivity layer 34a to be separated from the conductivity layer 34a and extending parallel to the conductivity layer 34a. The conductivity layer 34c is a plate-like conductivity layer provided above the conductivity layer 34b to be separated from the conductivity layer 34b and extending parallel to the conductivity layer 34b.

The conductivity layer 34d is a plate-like conductivity layer provided above the conductivity layer 34c to be separated from the conductivity layer 34c, such that end portions of the conductivity layers 34a, 34b, and 34c have protruding staircase shapes in the first staircase region, and extending parallel to the conductivity layer 34c.

The conductivity layer 34e is a plate-like conductivity layer provided above the conductivity layer 34d to be separated from the conductivity layer 34d and extending parallel to the conductivity layer 34d. The conductivity layer 34f is a plate-like conductivity layer provided above the conductivity layer 34e to be separated from the conductivity layer 34e and extending parallel to the conductivity layer 34e.

The conductivity layer 34g is a plate-like conductivity layer provided above the conductivity layer 34f to be separated from the conductivity layer 34f, such that end portions of the conductivity layers 34d, 34e, and 34f have protruding staircase shapes in the first staircase region, and extending parallel to the conductivity layer 34f.

The conductivity layer 34h is a plate-like conductivity layer provided above the conductivity layer 34g to be separated from the conductivity layer 34g and extending parallel to the conductivity layer 34g. The conductivity layer 34i is a plate-like conductivity layer provided above the conductivity layer 34h to be separated from the conductivity layer 34h and extending parallel to the conductivity layer 34h.

The conductivity layer 34c is an example of a first conductivity layer. The conductivity layer 34f is an example of a second conductivity layer.

The conductivity layers 34a, 34b, 34c, 34d, 34e, 34f, 34g, 34h, and 34i function as the word lines WL.

In the semiconductor memory device 100 according to the embodiment, the number of conductivity layers 34 is nine, but the number of the conductivity layers 34 is not limited thereto.

In the first staircase region, electrode members 58 are provided. In the example of FIG. 2, electrode members 58a, 58b, and 58c are provided. Each of the electrode members 58 functions as a contact for connecting the conductivity layer 34 of the corresponding hierarchy and the wiring 22 of the substrate side.

The electrode member 58a is connected to the conductivity layer 34c at a side surface or a bottom surface of the conductivity layer 34c, at a position where the conductivity layers 34a, 34b, and 34c in the first staircase region protrude with respect to the conductivity layers 34d, 34e, 34f, 34g, 34h, and 34i. The electrode member 58a extends from the conductivity layer 34c to a substrate (here, the "substrate" includes the integrated circuit 20 formed on the substrate 10). The electrode member 58a penetrates the conductivity layers 34a and 34b on the lower layer side than the conductivity layer 34c. Although not shown in FIG. 2, an electrode member extending from the conductivity layer 34a to the substrate 10 and an electrode member extending from the conductivity layer 34b to the substrate 10 are provided at positions overlapping with the electrode member 58a, on the inner side toward a plane of paper of FIG. 2. The electrode member extending from the conductivity layer 34b to the substrate 10 penetrates the conductivity layer 34a on the lower layer side than the conductivity layer 34b.

The electrode member 58b is connected to the conductivity layer 34f at a side surface or a bottom surface of the conductivity layer 34f, at a position where the conductivity layers 34d, 34e, and 34f in the first staircase region overlap with the conductivity layers 34a, 34b, and 34c and protrude with respect to the conductivity layers 34g, 34h, and 34i. The electrode member 58b extends from the conductivity layer 34f to the substrate (here, the "substrate" includes the integrated circuit 20 formed on the substrate 10) and penetrates the conductivity layers 34a, 34b, 34c, 34d, and 34e on the lower layer side of the conductivity layer 34f. Although not shown in FIG. 2, an electrode member extending from the conductivity layer 34d to the substrate 10 and an electrode member extending from the conductivity layer 34e to the substrate 10 are provided, for example, at positions overlapping with the electrode member 58b, on the inner side toward the plane of paper of FIG. 2. The electrode member extending from the conductivity layer 34d to the substrate 10 penetrates the conductivity layers 34a, 34b, and 34c on the lower layer side than the conductivity layer 34d. The electrode member extending from the conductivity layer 34e to the substrate 10 penetrates the conductivity layers 34a, 34b, 34c, and 34d on the lower layer side than the conductivity layer 34e.

The electrode member 58c extends from the conductivity layer 34i to the substrate (here, the "substrate" includes the integrated circuit 20 formed on the substrate 10), at a position where the conductivity layers 34a, 34b, 34c, 34d, 34e, 34f, 34g, 34h, and 34i overlap, in the first staircase region. The electrode member 58c penetrates the conductivity layers 34a, 34b, 34c, 34d, 34e, 34f, 34g, and 34h on the lower layer side than the conductivity layer 34i. Although not shown in FIG. 2, an electrode member extending from the conductivity layer 34g to the substrate 10 and an electrode member extending from the conductivity layer 34h to the substrate 10 are provided, for example, at positions overlapping with the electrode member 58c, on the inner side toward the plane of paper of FIG. 2. The electrode member extending from the conductivity layer 34g to the substrate 10 penetrates the conductivity layers 34a, 34b, 34c, 34d, 34e, and 34f on the lower layer side than the conductivity layer 34g. The electrode member extending from the conductivity layer 34h to the substrate 10 penetrates the conductivity layers 34a, 34b, 34c, 34d, 34e, 34f, and 34g on the lower layer side than the conductivity layer 34h.

In addition, a top surface of the conductivity layer 34a of a portion to which the electrode member 58 is connected at a position where the end portion of the conductivity layer 34a protrudes is provided under a bottom surface of the conductivity layer 34b. In other words, an uppermost portion of the conductivity layer 34a and the electrode member 58 connected to the conductivity layer 34a does not protrude to a height of the conductivity layer 34b, even when a protrusion is formed in a connection portion. Likewise, a top surface of the conductivity layer 34b at a position where the end portion of the conductivity layer 34b protrudes is provided under a bottom surface of the conductivity layer 34c, even when a protrusion is formed in a connection portion with the electrode member 58. A top surface of the conductivity layer 34c at a position where the end portion of the conductivity layer 34c protrudes is provided under a bottom surface of the conductivity layer 34d, even when a protrusion is formed in a connection portion with the electrode member 58a. A top surface of the conductivity layer 34d at a position where the end portion of the conductivity layer 34d protrudes is provided under a bottom surface of the conductivity layer 34e, even when a protrusion is formed in a connection portion with the electrode member 58. A top surface of the conductivity layer 34e at a position where the end portion of the conductivity layer 34e protrudes is provided under a bottom surface of the conductivity layer 34f, even when a protrusion is formed in a connection portion with the electrode member 58. A top surface of the conductivity layer 34f at a position where the end portion of the conductivity layer 34f protrudes is provided under a bottom surface of the conductivity layer 34g, even when a protrusion is formed in a connection portion with the electrode member 58b. A top surface of the conductivity layer 34g at a position where the end portion of the conductivity layer 34g protrudes is provided under a bottom surface of the conductivity layer 34h, even when a protrusion is formed in a connection portion with the electrode member 58. A top surface of the conductivity layer 34h at a position where the end portion of the conductivity layer 34h protrudes is provided under a bottom surface of the conductivity layer 34i, even when a protrusion is formed in a connection portion with the electrode member 58.

The electrode member 58 extending from the conductivity layers 34a, 34b, 34c, 34d, 34e, 34f, 34g, 34h, and 34i to the substrate 10 is not provided in the second staircase region.

As an example of materials of the conductivity layers 34a, 34b, 34c, 34d, 34e, 34f, 34g, 34h, and 34i, tungsten, titanium nitride, or copper is preferably used. As the materials of the conductivity layers 34a, 34b, 34c, 34d, 34e, 34f, 34g, 34h, and 34i, conductivity materials such as other metals, metal semiconductor compounds, and semiconductors may be used.

As an example of materials of the electrode members 58a, 58b, and 58c (and other electrode members described above (not shown in the drawings)), tungsten, titanium nitride, or copper is preferably used. As the materials of the electrode members 58a, 58b, and 58c, conductivity materials such as other metals, metal semiconductor compounds, and semiconductors may be used.

A memory hole 70 penetrates the conductivity layers 34a, 34b, 34c, 34d, 34e, 34f, 34g, 34h, and 34i in the memory cell region.

Vias 30, 31, and 32 are provided in a via region. The vias 30 and 31 penetrate the conductivity layers 34a, 34b, 34c, 34d, 34e, 34f, 34g, 34h, and 34i and the buried source line 44 and are electrically connected to, for example, the wirings 22. The via 32 penetrates the conductivity layers 34a, 34b, 34c, 34d, 34e, 34f, 34g, 34h, and 34i and is electrically connected to, for example, the buried source line 44. A barrier metal film and an insulating film not shown in the drawings are provided around the vias 30 and 31 and are electrically insulated from the conductivity layers 34a, 34b, 34c, 34d, 34e, 34f, 34g, 34h, and 34i and the buried source line 44. A barrier metal film and an insulating layer not shown in the drawings are provided around the via 32 and are electrically insulated from the conductivity layers 34a, 34b, 34c, 34d, 34e, 34f, 34g, 34h, and 34i.

As the materials of the vias 30, 31, and 32, for example, tungsten is preferably used.

The via 24 is electrically connected to the transistor 18c provided in the substrate 10 via the wiring 22 and the contact 23.

The electrode member 58a, the electrode member 58b, and the electrode member 58c are electrically connected to the transistor 18a and the transistor 18b via the wiring 22 and the contact 23.

The electrode member 58a is an example of a first contact. The electrode member 58b is an example of a second contact.

The via 26 connected to the buried source line 44 is electrically connected to a transistor (the same element as the transistor 18) not shown in the drawings via the wiring 22 and the contact 23.

A reinforcing member 80 extends perpendicularly to a plane of the substrate 10 in the first staircase region and the second staircase region. As a material of the reinforcing member 80, for example, silicon oxide is preferably used. As described later, a silicon nitride layer is first formed instead of each conductivity layer 34 and the silicon nitride layer is substituted by the conductivity layer 34. At this time, the reinforcing member 80 is provided to maintain a stacked structure temporarily for cavitation.

Figure 3:
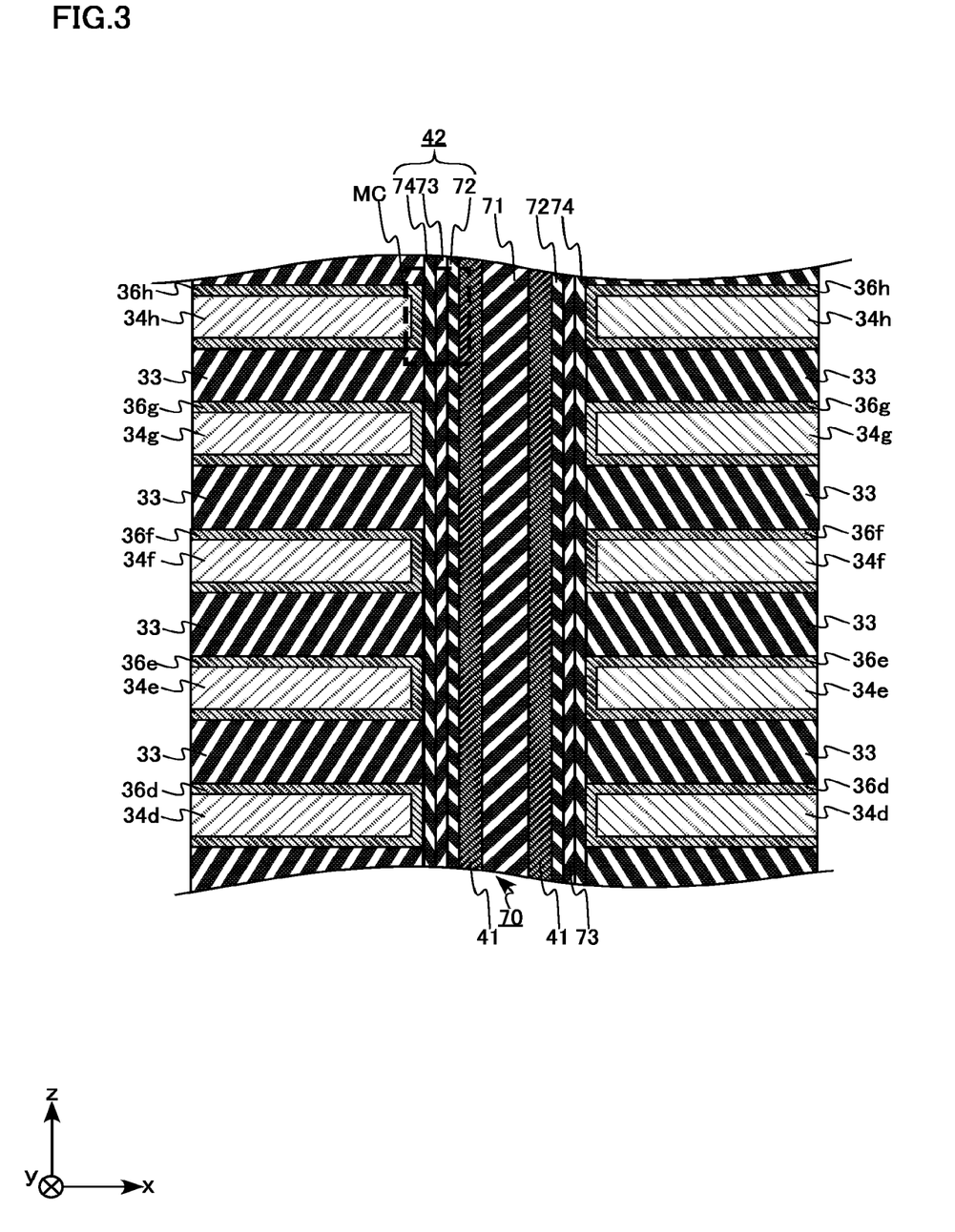
FIG. 3 is a schematic cross-sectional view of the vicinity of a memory hole of the semiconductor memory device according to the embodiment.

FIG. 3 is a schematic cross-sectional view of the vicinity of the memory hole 70 of the semiconductor memory device 100 according to the embodiment.

A core member 71 is provided in the memory hole 70. The core member 71 is, for example, silicon oxide.

A channel body 41 is provided around the core member 71 in the memory hole 70. The channel body 41 is a pillar including a semiconductor material such as silicon, for example. The channel body 41 is electrically connected to the buried source line 44.

A tunnel insulating film 72 is provided around the channel body 41. A charge accumulation film 73 (charge accumulation portion) is provided around the tunnel insulating film 72. A block insulating film 74 is provided around the charge accumulation film 73.

The tunnel insulating film 72 is an insulating film that has an insulating property, but allows a current to flow by application of a predetermined voltage. The tunnel insulating film 72 includes, for example, silicon oxide.

The charge accumulation film 73 is a film including a material capable of accumulating charges. The charge accumulation film 73 includes, for example, silicon nitride.

The block insulating film 74 is a film that suppresses the flow of charges between the charge accumulation film 73 and the conductivity layer 34. The block insulating film 74 includes, for example, silicon oxide.

A memory film 42 has the tunnel insulating film 72, the charge accumulation film 73, and the block insulating film 74.

A region shown by a dotted line in FIG. 3 is one memory cell MC. For example, the conductivity layer 34h (word line), the memory film 42, and the channel body 41 form one memory cell transistor MT. A plurality of memory cells MC provided in one memory hole 70 are included in one memory string MS.

Figure 4:
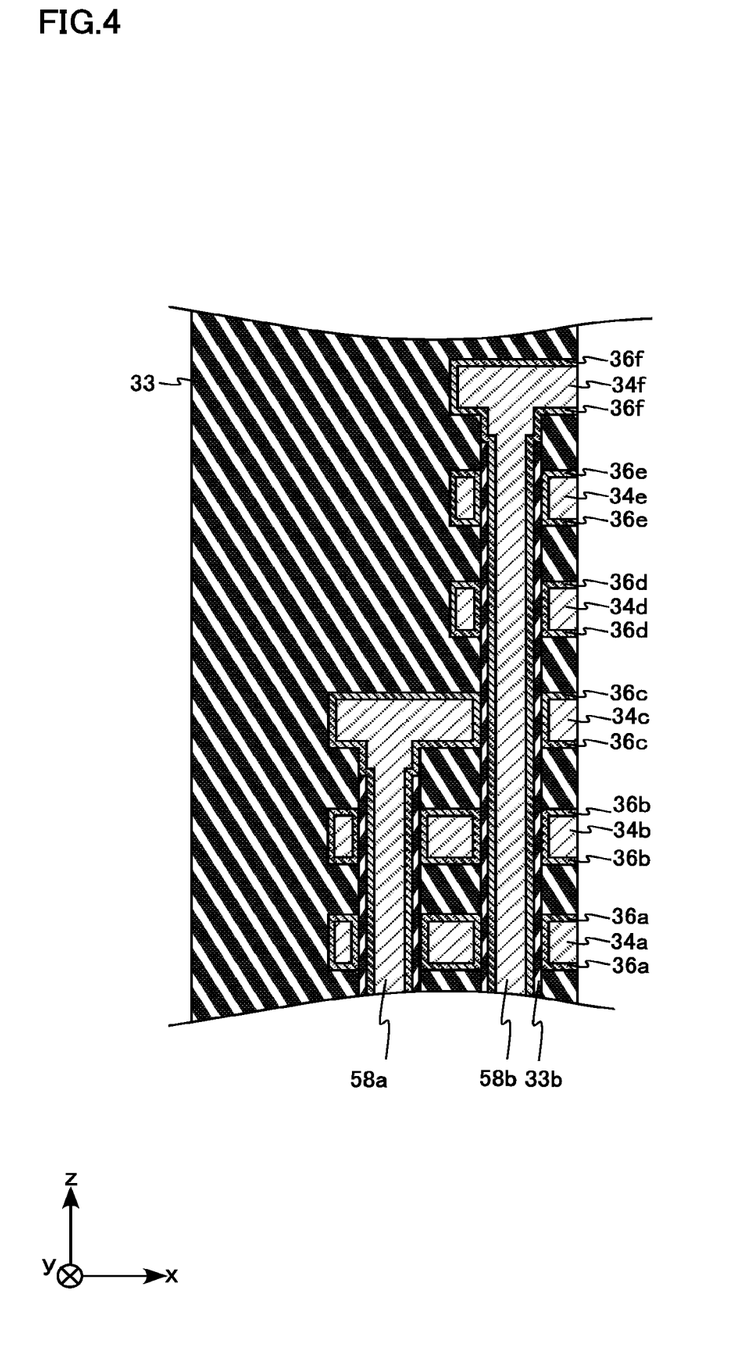
FIG. 4 is a schematic cross-sectional view of the vicinity of a region where a conductivity layer and an electrode member of the semiconductor memory device according to the embodiment cross.

FIG. 4 is a schematic cross-sectional view of the vicinity of a region where the conductivity layer and the electrode member of the semiconductor memory device 100 according to the embodiment cross.

A barrier metal film 36a is provided to cover the conductivity layer 34a. A barrier metal film 36b is provided to cover the conductivity layer 34b. A barrier metal film 36c is provided to integrally cover the conductivity layer 34c and the electrode member 58a. A barrier metal film 36d is provided to cover the conductivity layer 34d. A barrier metal film 36e is provided to cover the conductivity layer 34e. A barrier metal film 36f is provided to integrally cover the conductivity layer 34f and the electrode member 58b. As shown in FIG. 3, a barrier metal film 36g is provided to cover the conductivity layer 34g. A barrier metal film 36h is provided to cover the conductivity layer 34h. The barrier metal films 36a, 36b, 36c, 36d, 36e, 36f, 36g, and 36h include, for example, titanium nitride (TiN).

For example, in a region where the conductivity layer 34c and the electrode member 58b cross, as shown in FIG. 4, the conductivity layer 34c, the barrier metal film 36c (a part of the barrier metal film), the insulating layer 33b (the insulating film spacer), the barrier metal film 36f (another part of the barrier metal film), and the electrode member 58b are provided to be connected in this order.

Figure 5:
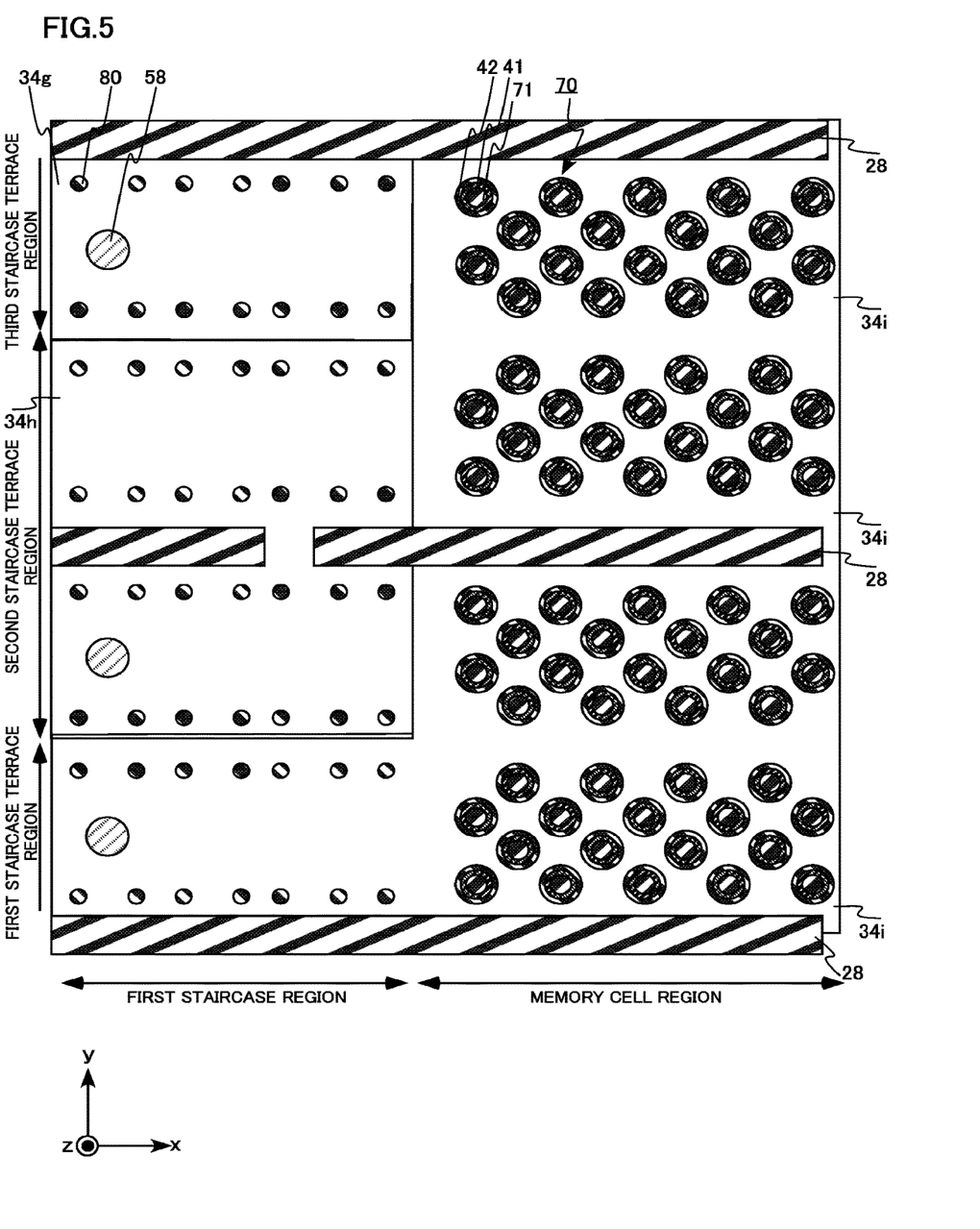
FIG. 5 is a schematic diagram of a first staircase region and a memory cell region of the semiconductor memory device according to the embodiment.

FIG. 5 is a schematic diagram of the first staircase region and the memory cell region of the semiconductor memory device 100 according to the embodiment. FIG. 5 is a schematic top view of a conductivity layer of an uppermost layer of the plurality of memory cell transistors MT forming the memory string MS in the first staircase region and the memory cell region of the semiconductor memory device 100 according to the embodiment. A hierarchy of the drain select transistor STD shown in FIG. 1 is formed above the conductivity layer shown in FIG. 5. Illustration of the insulating layer 33 is omitted.

A first staircase terrace region, a second staircase terrace region, and a third staircase terrace region that are parallel to the plane of the substrate 10 and have different distances from the substrate 10 are provided sequentially in a y direction. The first staircase terrace region corresponds to the hierarchy of the conductivity layer 34i. The second staircase terrace region corresponds to the hierarchy of the conductivity layer 34h. The third staircase terrace region corresponds to the hierarchy of the conductivity layer 34g. In other words, in the configuration of FIG. 2, each conductivity layer 34 is formed stepwise in the first staircase region not only in the x direction but also in a direction toward the inner side of the plane of paper (the y direction). In the example of FIG. 5, a diagram viewed from the hierarchy of the conductivity layer 34i is shown. Similarly, in the case of being viewed from the hierarchy of the conductivity layer 34f, the first staircase terrace region, the second staircase terrace region, and the third staircase terrace region are provided. The first staircase terrace region corresponds to the hierarchy of the conductivity layer 34f. The second staircase terrace region corresponds to the hierarchy of the conductivity layer 34e. The third staircase terrace region corresponds to the hierarchy of the conductivity layer 34d. Similarly, in the case of being viewed from the hierarchy of the conductivity layer 34c, the first staircase terrace region, the second staircase terrace region, and the third staircase terrace region are provided. The first staircase terrace region corresponds to the hierarchy of the conductivity layer 34c. The second staircase terrace region corresponds to the hierarchy of the conductivity layer 34b. The third staircase terrace region corresponds to the hierarchy of the conductivity layer 34a. In addition, each conductivity layer 34 is provided with the electrode member 58 electrically connected as described above. In addition, the reinforcing member 80 is provided around each electrode member 58.

A slit region 28 is a portion provided with a groove used for introducing and discharging a wet etching solution used for forming the conductivity layer 34 and the electrode member 58 and introducing a conductivity material, at the time of manufacturing the semiconductor memory device 100 to be described later. After the introduction of the conductivity material is performed, the groove is buried with, for example, silicon oxide or the like and the slit region 28 is formed.

The reinforcing members 80 are provided in the first staircase region including a border region between the region where the electrode member 58 is provided and the region where the memory hole 70 is provided. Further, an electrode member (not shown in the drawings) for electrical connection to the drain select gate lines SGD is provided and is connected to a wiring (not shown in the drawings) provided in the upper layer of the first staircase region. The wiring provided in the upper layer of the first staircase region is connected to the integrated circuit 20 via a via (not shown in the drawings) provided outside the first staircase region.

The number and arrangement of conductivity layers 34, the number and arrangement of electrode members 58, the number and arrangement of reinforcing members 80, and the number and arrangement of memory holes 70 are not limited to those shown in FIG. 5.

Figure 6:
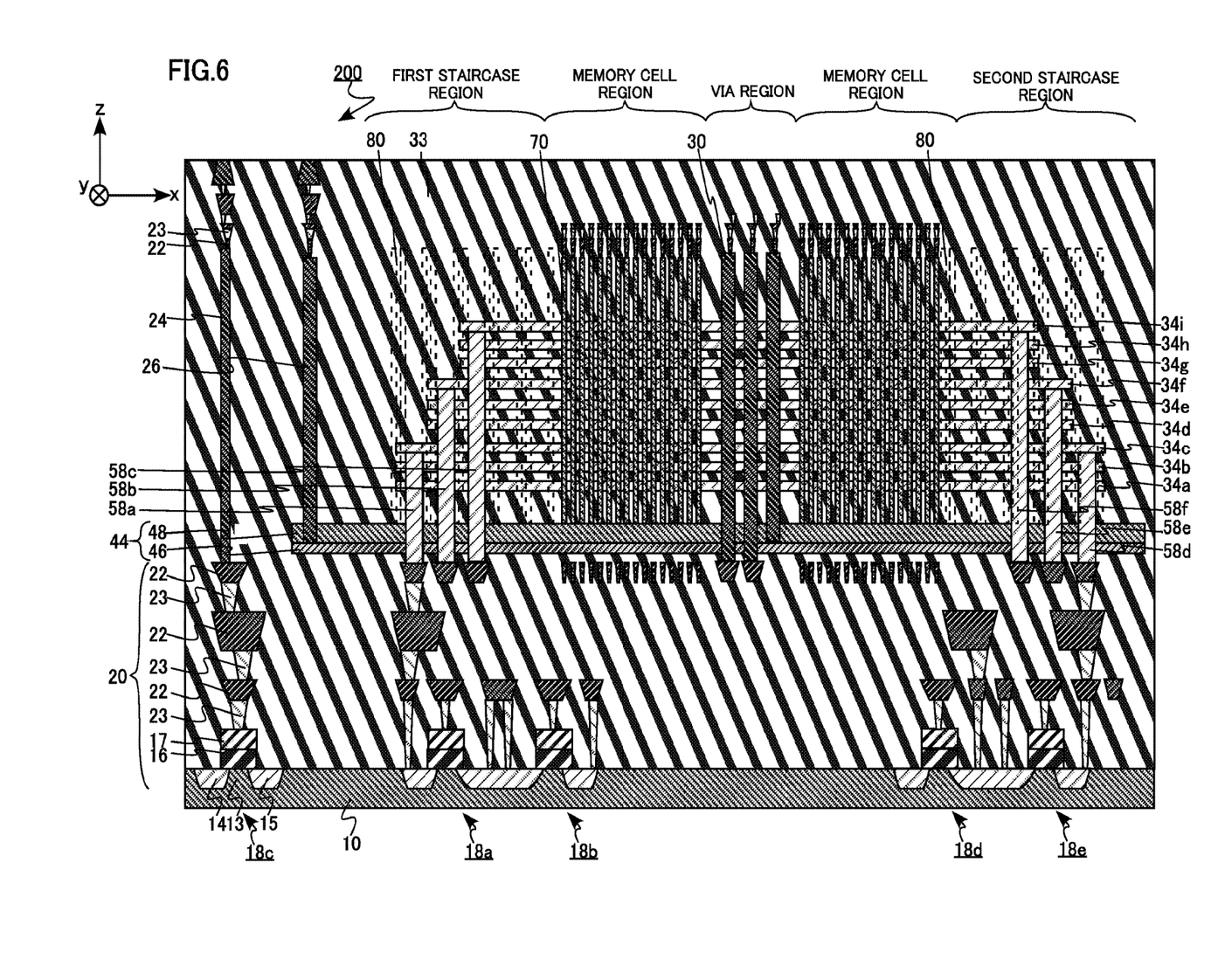
FIG. 6 is a schematic cross-sectional view of a semiconductor memory device according to a modification of the embodiment.

FIG. 6 is a schematic cross-sectional view of a semiconductor memory device 200 according to a modification of the embodiment. In the example of FIG. 2, the case where the electrode member 58 is provided in one end portion of the conductivity layer 34 has been described. However, the present disclosure is not limited thereto. As shown in FIG. 6, in the modification, electrode members 58d, 58e, and 58f are provided not only in the first staircase region but also in the second staircase region. A transistor 18*d* and a transistor 18*e* are provided in the substrate 10 below the second staircase region. In the second staircase region, the transistor 18*d* and the transistor 18*e* are electrically connected to the conductivity layer 34 via the electrode member 58. Because a structure may be the same as that in the case of the first staircase region, description thereof is omitted.

FIGS. 7A to 7I are schematic views showing a cross-section of the semiconductor memory device 100 according to the embodiment in the middle of manufacture in a method of manufacturing the semiconductor memory device 100.

Figure 7A:
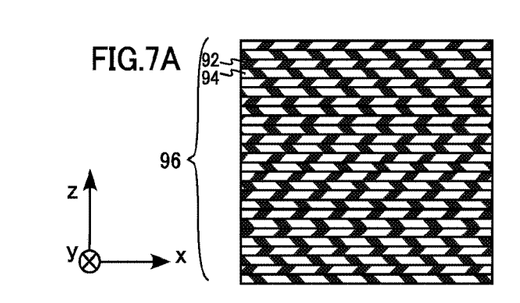
FIGS. 7A to 7I are schematic views showing a cross-section of the semiconductor memory device according to the embodiment in the middle of manufacture in a method of manufacturing a main part of the semiconductor memory device.

First, as shown in FIG. 7A, a stacked body 96 of a nitride film 92 and an oxide film 94 is formed. The nitride film 92 includes, for example, silicon nitride. The oxide film 94 includes, for example, silicon oxide.

Figure 7B:
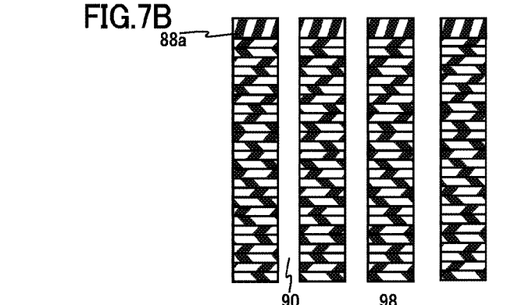

Next, a pattern of a resist 88*a* is formed on the stacked body 96. Next, as shown in FIG. 7B, a plurality of through-holes 90 are formed with respect to the stacked body 96 by using, for example, photolithography and reactive ion etching (RIE) with the resist 88*a* as a mask.

Figure 7C:
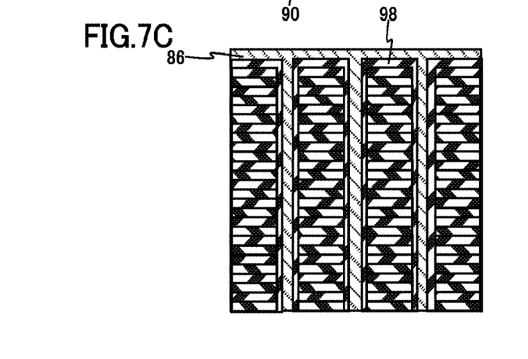

Next, the resist 88*a* is removed. Next, as shown in FIG. 7C, a surface layer 98 including silicon oxide is formed on the stacked body 96 and in the through-hole 90. Next, amorphous silicon 86 is formed on the surface layer 98 and in the through-hole 90.

Figure 7D:
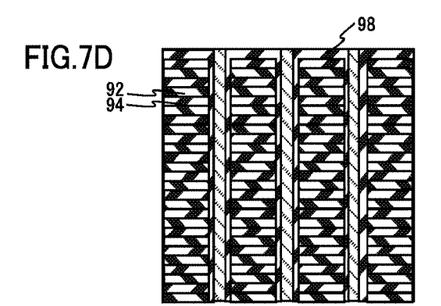

Next, as shown in FIG. 7D, a part of the amorphous silicon 86 formed on the stacked body 96 is removed by, for example, etch-back, and the amorphous silicon 86 formed in the through-hole 90 is left.

Figure 7E:
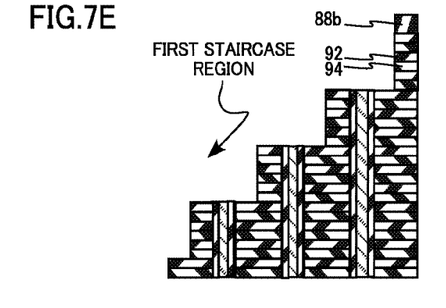

Next, a pattern of the resist 88*b* is formed on the stacked body 96. Next, as shown in FIG. 7E, the first staircase region is formed in the stacked body 96 by repeating removal of a part of the resist 88*b* by an asking method and removal of a part of the stacked body 96.

Figure 7F:
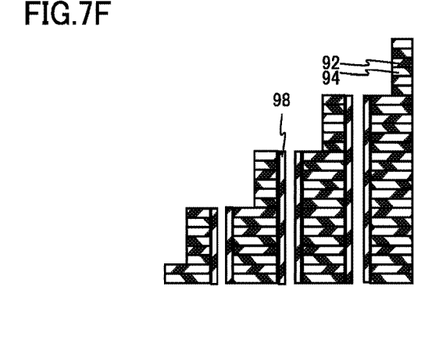

Next, as shown in FIG. 7F, the amorphous silicon 86 formed in the through-hole 90 is removed by using, for example, a trimethyl-2-hydroxyethylammonium hydroxide aqueous solution.

Figure 7G:
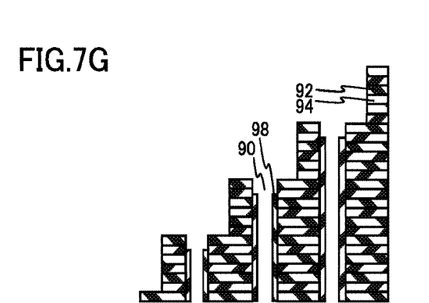

Next, as shown in FIG. 7G, a part of the surface layer 98 is removed by, for example, etch-back using RIE and a top surface and a side surface of the nitride film 92 provided in the upper layer in the first staircase region are exposed. The surface layer 98 of the upper portion in the through-hole 90 is removed. On the other hand, the surface layer 98 other than the upper portion in the through-hole 90 is left in the through-hole 90 without being removed.

Figure 7H:
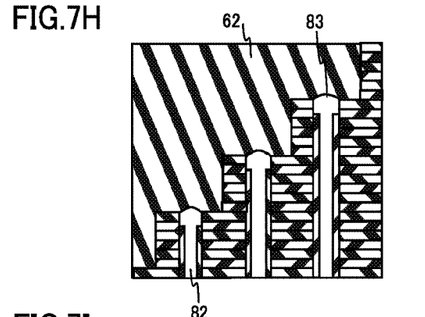

Next, as shown in FIG. 7H, an insulating film 62 is formed on the first staircase region such that holes 82 are formed in the through-hole 90. Then, the insulating film 62 is planarized. At this time, it is preferable to form the insulating film 62 at a high film formation rate because the holes 82 are easily formed. It is difficult to form and cover the insulating film 62 until a height of an upper part of the hole 82 becomes the same height as a height of a top surface of the nitride film 92 around the upper part of the hole 82. Therefore, on the hole 82, the insulating film 62 is not formed and a dome-shaped cavity 83 is formed.

Next, a slit not shown in the drawings is formed in the insulating film 62 and the stacked body 96. Next, the nitride film 92 is removed by wet etching via the slit. Next, a barrier metal film not shown in the drawings is formed on a surface of the oxide film 94, a surface of the surface layer 98, and a surface of the insulating film 62 in the portion from which the nitride film 92 has been removed, the hole 82, and the dome-shaped cavity 83. Next, a second conductivity material including, for example, tungsten is formed via the slit. The insulating film 62, the oxide film 94, and the surface layer 98 become the insulating layer 33. The conductivity layer 34 and the electrode member 58 are integrally formed by the second conductivity material (refer to FIG. 7I). The conductivity layer 34 is connected to the electrode member 58 on a bottom surface 35 of the conductivity layer 34. By the second conductivity material introduced into the dome-shaped cavity 83, a protrusion 84 is formed integrally with the conductivity layer 34 and the electrode member 58 on the top surface of the protruding portion of the conductivity layer 34. The barrier metal film is formed to integrally cover the top surface of the conductivity layer 34, the bottom surface of the conductivity layer 34, the outer surface 39 of the conductivity layer 34, the top surface of the protrusion 84, and the surface of the electrode member 58. At this time, a part of the hole 82 may be left to form the second conductivity material not only in the portion where the nitride film 92 exists but also in the through-hole 90. Then, an insulating material is buried in the slit.

Figure 7I:
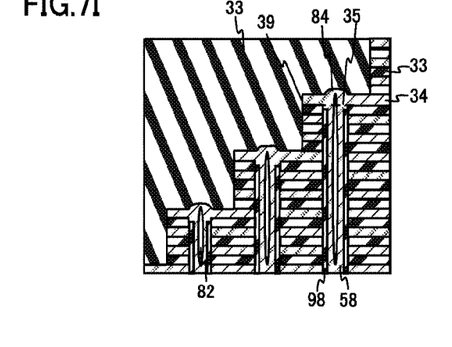

A diameter size of the through-hole 90 is smaller by one step in the lower portion in the through-hole 90 in which the surface layer 98 is left as compared with a portion near an upper end in the through-hole 90 from which the surface layer 98 has been removed. Therefore, as compared with a diameter size of the electrode member 58 formed in the portion near the upper end in the through-hole 90, a diameter size of the electrode member 58 formed in the lower portion of the through-hole 90 in which the surface layer 98 is left is smaller by one step. In addition, the conductivity layer 34 and the protrusion 84 on the top surface of the conductivity layer 34 to be the uppermost portion of the electrode member 58 in each hierarchy are provided in each staircase terrace region while the surface of the protrusion 84 has a step corresponding to the conductivity layer 34 formed in a staircase shape.

FIGS. 8A to 8I are schematic views showing a cross-section of the semiconductor memory device according to the embodiment in the middle of manufacture in a modification of the method of manufacturing the semiconductor memory device 100.

Figure 8A:
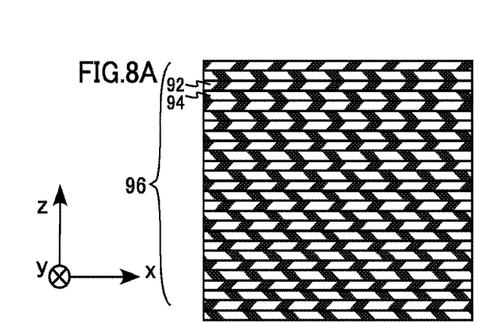
FIGS. 8A to 8I are schematic views showing a cross-section of the semiconductor memory device according to the embodiment in the middle of manufacture in a modification of the method of manufacturing the main part of the semiconductor memory device.

First, as shown in FIG. 8A, the stacked body 96 of the nitride film 92 and the oxide film 94 is formed. The nitride film 92 includes, for example, silicon nitride. The oxide film 94 includes, for example, silicon oxide.

Figure 8B:
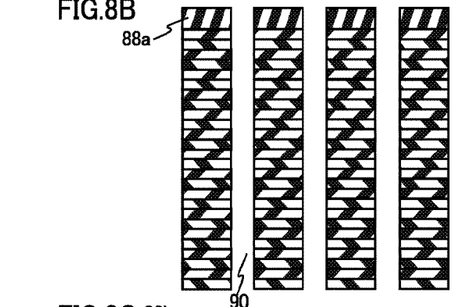

Next, a pattern of a resist 88*a* is formed on the stacked body 96. Next, as shown in FIG. 8B, a plurality of through-holes 90 are formed with respect to the stacked body 96 by using, for example, photolithography and reactive ion etching (RIE) with the resist 88*a* as a mask.

Figure 8C:
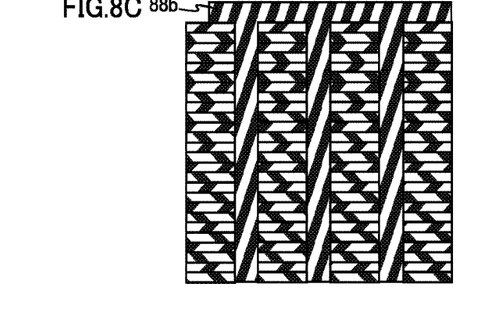

Next, the resist 88*a* is removed. Next, as shown in FIG. 8C, a pattern of the resist 88*b* is formed in the through-hole 90 and on the stacked body 96.

Figure 8D:
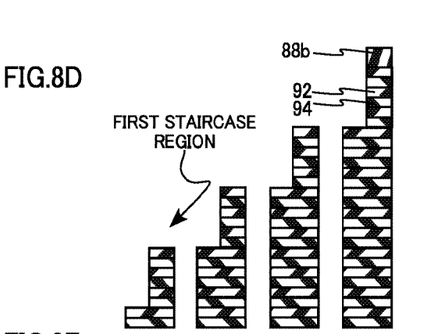

Next, as shown in FIG. 8D, a part of the resist 88*b* is removed by, for example, the ashing method. Next, a part of the stacked body 96 provided below the removed part of the resist 88*b* is removed by, for example, RIE. As such, the first staircase region is formed in the stacked body 96 by repeating removal of a part of the resist 88*b* by the ashing method and removal of a part of the stacked body 96 by RIE.

Figure 8E:
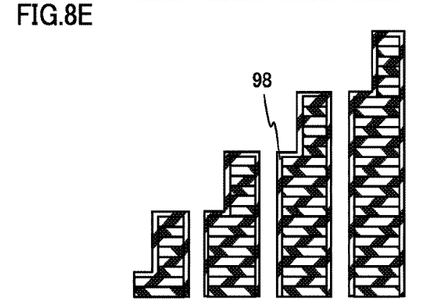

Next, as shown in FIG. 8E, the surface layer 98 including silicon oxide is formed on the surface of the stacked body 96 and in the through-hole 90 in the first staircase region.

Figure 8F:
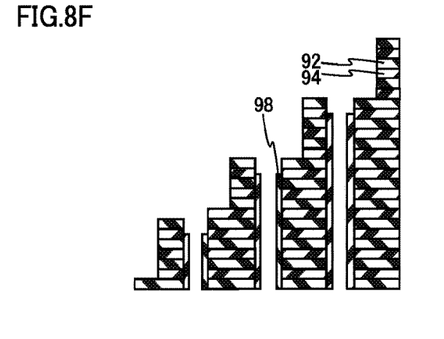

Next, as shown in FIG. 8F, a part of the surface layer 98 is removed by, for example, etch-back using RIE and the top surface and the side surface of the nitride film 92 of the upper layer in the first staircase region are exposed.

Figure 8G:
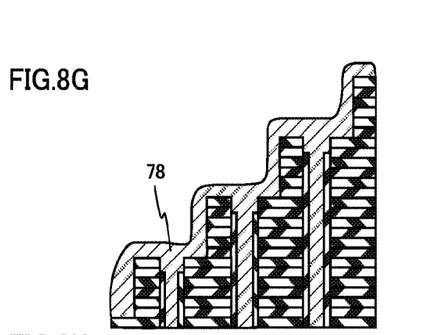

Next, the barrier metal film (not shown in the drawings) including, for example, titanium nitride is formed on the exposed top surface and side surface of the first staircase region and the surface of the surface layer 98. Next, as shown in FIG. 8G, a first conductivity material 78 including tungsten is formed in the through-hole 90 and on the first staircase region by, for example, plasma CVD.

Figure 8H:
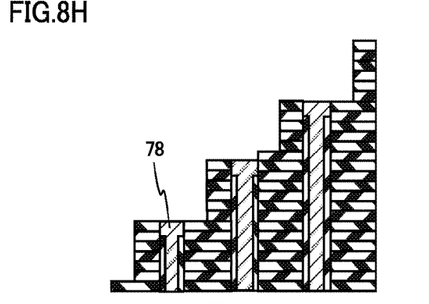

Next, as shown in FIG. 8H, the first conductivity material 78 formed outside the through-hole 90 is removed by, for example, isotropic etch-back to expose the top surface and the side surface of the first staircase region.

Figure 8I:
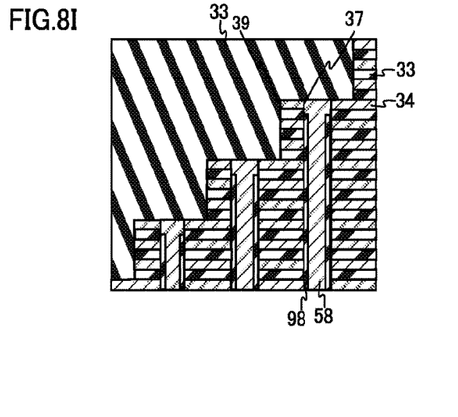

Next, as shown in FIG. 8I, the insulating film 62 is formed on the first staircase region and is then planarized. Next, a slit not shown in the drawings is formed in the insulating film 62 and the stacked body 96. Next, the nitride film 92 is removed by wet etching via the slit. Next, the barrier metal film (not shown in the drawings) including, for example, titanium nitride is formed on the surface of the oxide film 94 of the portion from which the nitride film 92 has been removed. Illustration of the barrier metal film is omitted.

Next, the second conductivity material is buried in the portion from which the nitride film 92 has been removed, by introducing tungsten via the slit.

The insulating film 62, the oxide film 94, and the surface layer 98 become the insulating layer 33. The first conductivity material 78 becomes the electrode member 58. In addition, the second conductivity material becomes the conductivity layer 34. That is, according to the manufacturing method shown in FIGS. 8A to 8I, the conductivity layer 34 and the electrode member 58 are separately formed, different from the manufacturing method of FIGS. 7A to 7I. In addition, the conductivity layer 34 is connected to the electrode member 58 via the barrier metal layer covering the conductivity layer 34 on the inner surface (side surface) 37 of the conductivity layer 34. Furthermore, the barrier metal layer is formed to cover the top surface of the conductivity layer 34, the bottom surface of the conductivity layer 34, and the outer surface 39 of the conductivity layer. In addition, the barrier metal layer is formed to cover the surface of the electrode member 58.

Instead of the nitride film 92, a silicon film including, for example, phosphorus (P) may be used. This is because the silicon film including phosphorus (P) has conductivity, so that it is possible to omit the process for removing the nitride film 92 by wet etching as shown in FIG. 8I.

The shapes of the conductivity layer 34 and the electrode member 58 are not limited to those shown in FIGS. 8A to 8I.

Next, functions and effects of the embodiment are described.

The case where the electrode member extends upward from the conductivity layer 34 and is connected to the integrated circuit 20 via the wiring provided in the upper layer of the first staircase region and the via provided outside the first staircase region is considered. In this case, because a wiring length increases, wiring resistance increases.

Each of the semiconductor memory devices 100 and 200 according to the embodiment includes the electrode member 58a connected to the conductivity layer 34c at the side surface or the bottom surface of the conductivity layer 34c at the position where the end portion of the conductivity layer 34c in the first staircase region protrudes and extending from the conductivity layer 34c toward the substrate 10. Each of the semiconductor memory devices 100 and 200 further includes the electrode member 58b connected to the conductivity layer 34f at the side surface or the bottom surface of the conductivity layer 34f in the first staircase region and extending from the conductivity layer 34f toward the substrate 10 to penetrate the conductivity layer 34c. As such, the electrode member 58 is formed to extend toward the substrate 10, so that it is possible to connect the conductivity layer 34 and the integrated circuit 20 without going through a circuit having a large wiring length. Therefore, the length of the wiring from the conductivity layer 34 to the integrated circuit 20 decreases and the wiring resistance can be reduced.

In addition, in the semiconductor memory devices 100 and 200 according to the embodiment, the electrode member 58 is connected to the conductivity layer 34 at the side surface or the bottom surface of the conductivity layer 34. Therefore, the connection portion to connect the conductivity layer 34 and the electrode member 58 may not be additionally provided as compared with the case where the electrode member 58 is connected to the conductivity layer 34 at the top surface of the conductivity layer 34. As a result, occupancy of the connection portion of the conductivity layer 34 and the electrode member 58 can be scaled down.

Furthermore, when the upper portions of the electrode members 58a and 58b penetrate the conductivity layers 34c and 34f and, for example, further protrude to the portions above the conductivity layers 34c and 34f, parasitic capacitance between the electrode member 58a and the electrode member 58b or parasitic capacitance between the electrode member 58a and the conductivity layer 34f may increase. However, in the semiconductor memory devices 100 and 200 according to this embodiment, the uppermost portion of the conductivity layer 34c and the electrode member 58a at the position where the end portion of the conductivity layer 34c protrudes is provided under the bottom surface of the conductivity layer 34f. Further, for example, the diameter sizes of the portions of the electrode members 58a and 58b connected at the side surfaces or the bottom surfaces of the conductivity layer 34c and 34f have maximum diameter sizes. When the manufacturing method shown in FIGS. 7A to 7I is used, the protrusions 84 are formed on the top surfaces of the conductivity layers 34. However, top ends of the protrusions 84 on the top surfaces of the conductivity layers 34 are formed to have steps in heights and the protrusion 84 provided on the top surface of the conductivity layer 34c do not protrude to the height equal to or more than the height of the conductivity layer 34f. Further, the protrusions 84 are not formed with diameter sizes which are more than the diameter sizes at portions connected at the side surfaces or the bottom surfaces of the conductivity layer 34c and 34f. Therefore, it is possible to realize low impedance of the conductivity layer 34 and the electrode member 58 by reducing the parasitic capacitance.

As shown in FIG. 6, when the electrode member 58 penetrating the conductivity layer 34 is provided in both the first staircase region and the second staircase region and the transistor 18d or the transistor 18e is electrically connected to the conductivity layer 34 in the second staircase region, a drive circuit of a three-dimensional NAND flash memory is provided in both the first staircase region and the second staircase region. Therefore, because the number of drive circuits can be increased, it is possible to read or write data at higher speed.

While certain embodiments have been described, these embodiments have been presented by way of example only, and are not intended to limit the scope of the inventions. Indeed, the novel methods and devices described herein may be embodied in a variety of other forms; furthermore, various omissions, substitutions and changes in the form of the methods and devices described herein may be made without departing from the spirit of the inventions. The accompanying claims and their equivalents are intended to cover such forms or modifications as would fall within the scope and spirit of the inventions.

What is claimed is:
1. A semiconductor memory device comprising:
   a substrate;
   a plate-like first conductivity layer provided above the substrate and extending parallel to a substrate plane to bestride first and second regions;
   a plate-like second conductivity layer provided above the first conductivity layer to be separated from the first conductivity layer, an end portion of the first conductivity layer having a protruding staircase shape in the first region, the second conductivity layer extending parallel to the first conductivity layer to bestride the first and second regions;
   a first contact connected to the first conductivity layer at a side surface or a bottom surface of the first conductivity layer and extending from the first conductivity layer toward the substrate, the first contact being connected at a position where the end portion of the first conductivity layer in the first region protrudes, and a first diameter size of a first portion of the first contact connected at the side surface or the bottom surface of the first conductivity layer having a first maximum diameter size;
   a second contact connected to the second conductivity layer at a side surface or a bottom surface of the second conductivity layer in the first region and extending from the second conductivity layer toward the first conductivity layer in which the end portion of the first conductivity layer protrudes compared to that of the second conductivity layer in the staircase shape of the first region and toward the substrate to penetrate the first conductivity layer, a second diameter size of a second portion of the second contact connected at the side surface or the bottom surface of the second conductivity layer having a second maximum diameter size;
   a channel body penetrating the first and second conductivity layers in the second region; and
   a memory film including a charge accumulation portion provided between the first and second conductivity layers and the channel body in the second region.
2. The device according to claim 1, further comprising: a barrier metal film covering the first and second conductivity layers and the first and second contacts.
3. The device according to claim 1, further comprising: an insulating film provided between the first conductivity layer and the second contact.
4. The device according to claim 1, wherein each of the first and second contacts is electrically connected to a semiconductor element provided in the substrate.
5. The device according to claim 1, wherein an uppermost portion of the first conductivity layer and the first contact at the position where the end portion of the first conductivity layer protrudes is provided under the bottom surface of the second conductivity layer.
6. The device according to claim 1, wherein a third diameter size of a third portion of the second contact penetrating the first conductivity layer is smaller than the second diameter size of the second portion of the second contact connected to the second conductivity layer.
7. The device according to claim 1, wherein the first conductivity layer and the first contact are integrally formed and the second conductivity layer and the second contact are integrally formed.
8. The device according to claim 1, wherein a first protrusion is formed integrally with the first conductivity layer and the first contact on a top surface of the protruding end portion of the first conductivity layer, the first protrusion being provided under the bottom surface of the second conductivity layer.
9. A semiconductor memory device comprising:
   a substrate;
   a plate-like first conductivity layer provided above the substrate and extending parallel to a substrate plane to bestride first and second regions;
   a plate-like second conductivity layer provided above the first conductivity layer to be separated from the first conductivity layer, an end portion of the first conductivity layer having a protruding staircase shape in the first region, the second conductivity layer extending parallel to the first conductivity layer to bestride the first and second regions;
   a first contact formed to have a first smaller diameter size on a side of a layer below the first conductivity layer compared to a first diameter size of a first connection portion of the first contact with the first conductivity layer, at a position where the end portion of the first conductivity layer in the first region protrudes, the first contact extending from the first conductivity layer toward the substrate, and the first connection portion with the first conductivity layer having a first maximum diameter size;
   a second contact extending from the second conductivity layer toward the substrate to penetrate the first conductivity layer in the first region and having a second smaller diameter size in a penetration portion of the first conductivity layer compared to a second diameter size of a second connection portion of the second contact with the second conductivity layer, the second connection portion with the second conductivity layer having a second maximum diameter size;
   a channel body penetrating the first and second conductivity layers in the second region; and
   a memory film including a charge accumulation portion provided between the first and second conductivity layers and the channel body in the second region.
10. The device according to claim 9, further comprising: a barrier metal film covering the first and second conductivity layers and the first and second contacts.
11. The device according to claim 9, further comprising: an insulating film provided between the first conductivity layer and the second contact.
12. The device according to claim 9, wherein each of the first and second contacts is electrically connected to a semiconductor element provided in the substrate.
13. The device according to claim 9, wherein an uppermost portion of the first conductivity layer and the first contact at the position where the end portion of the first conductivity layer protrudes is provided under a bottom surface of the second conductivity layer.
14. The device according to claim 9, wherein the first conductivity layer and the first contact are integrally formed and the second conductivity layer and the second contact are integrally formed.
15. A semiconductor memory device comprising:
   a substrate;
   a plate-like first conductivity layer provided above the substrate and extending parallel to a substrate plane to bestride first and second regions;
   a plate-like second conductivity layer provided above the first conductivity layer to be separated from the first conductivity layer, an end portion of the first conductivity layer having a protruding staircase shape in the first region, the second conductivity layer extending parallel to the first conductivity layer to bestride the first and second regions;

a plate-like third conductivity layer provided above the second conductivity layer to be separated from the second conductivity layer, an end portion of the second conductivity layer having a protruding staircase shape in the first region, the third conductivity layer extending parallel to the first and second conductivity layers to bestride the first and second regions;

a first contact extending from the first conductivity layer toward the substrate not to protrude to a height of a bottom surface of the second conductivity layer, at a position where the end portion of the first conductivity layer in the first region protrudes;

a second contact extending from the second conductivity layer toward the first conductivity layer in which the end portion of the first conductivity layer protrudes compared to that of the second conductivity layer in the staircase shape of the first region and toward the substrate not to protrude to a height of a bottom surface of the third conductivity layer and to penetrate the first conductivity layer, at a position where the end portion of the second conductivity layer in the first region protrudes;

a channel body penetrating the first, second and third conductivity layers in the second region; and a memory film including a charge accumulation portion provided between the first, second and third conductivity layers and the channel body in the second region.

16. The device according to claim 15, further comprising: a barrier metal film covering the first, second, and third conductivity layers and the first and second contacts.

17. The device according to claim 15, further comprising: an insulating film provided between the first conductivity layer and the second contact.

18. The device according to claim 15, wherein each of the first and second contacts is electrically connected to a semiconductor element provided in the substrate.

19. The device according to claim 15, wherein a first protrusion is formed integrally with the first conductivity layer and the first contact on a top surface of the protruding end portion of the first conductivity layer, the first protrusion being provided under the bottom surface of the second conductivity layer; and a second protrusion is formed integrally with the second conductivity layer and the second contact on a top surface of the protruding end portion of the second conductivity layer, the second protrusion being provided under the bottom surface of the third conductivity layer.

20. The device according to claim 19, wherein a top end of the first protrusion and a top end of the second protrusion have a step corresponding to the staircase shapes of the first and second conductivity layers.

* * * * *